(12) United States Patent
Itaya et al.

(10) Patent No.: US 8,378,507 B2
(45) Date of Patent: Feb. 19, 2013

(54) SEMICONDUCTOR DEVICE AND METHOD OF BONDING WIRES BETWEEN SEMICONDUCTOR CHIP AND WIRING SUBSTRATE

(75) Inventors: Satoshi Itaya, Tokyo (JP); Dai Sasaki, Tokyo (JP); Mitsuaki Katagirl, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 203 days.

(21) Appl. No.: 12/572,326

(22) Filed: Oct. 2, 2009

(65) Prior Publication Data

US 2010/0084773 A1    Apr. 8, 2010

(30) Foreign Application Priority Data

Oct. 2, 2008    (JP) .................................. 2008-257367

(51) Int. Cl.
*H01L 23/49*    (2006.01)
(52) U.S. Cl. ... 257/784; 257/692; 257/786; 257/E23.02; 257/E23.023; 257/E23.068; 438/617
(58) Field of Classification Search .................. 257/678, 257/690, 692, 734, 784, 786, E23.02, E23.024, 257/E23.068; 438/617
See application file for complete search history.

(56) References Cited

U.S. PATENT DOCUMENTS

| | | | | |
|---|---|---|---|---|
| 5,196,992 A * | 3/1993 | Sawaya | ........................ | 361/736 |
| 5,311,057 A * | 5/1994 | McShane | ..................... | 257/676 |
| 5,838,072 A * | 11/1998 | Li et al. | ......................... | 257/786 |
| 6,380,635 B1 * | 4/2002 | Manning et al. | ............. | 257/784 |
| 6,982,220 B1 * | 1/2006 | Liou | ............................ | 438/617 |
| 7,326,594 B2 * | 2/2008 | Beauchamp et al. | ........ | 438/123 |
| 2005/0035461 A1 * | 2/2005 | Wu et al. | ...................... | 257/777 |
| 2005/0164486 A1 * | 7/2005 | Lua et al. | ..................... | 438/617 |
| 2007/0029661 A1 * | 2/2007 | Beddingfield et al. | ....... | 257/691 |
| 2007/0197030 A1 * | 8/2007 | Kim et al. | .................... | 438/674 |
| 2009/0101923 A1 * | 4/2009 | Choi et al. | .................... | 257/89 |

FOREIGN PATENT DOCUMENTS

| | | |
|---|---|---|
| JP | 11-307483 | 5/1999 |
| JP | 2003-068782 | 3/2003 |
| JP | 2008-066389 | 3/2008 |

* cited by examiner

*Primary Examiner* — Eduardo A Rodela
(74) *Attorney, Agent, or Firm* — Young & Thompson

(57) ABSTRACT

A wiring substrate and a semiconductor chip mounted on the wiring substrate are connected together via a bonding wire. The distance from each end of the semiconductor chip to a wire bond pad provided on the wiring substrate is smaller than the height of the semiconductor chip.

10 Claims, 12 Drawing Sheets

SEMICONDUCTOR DEVICE AND METHOD OF BONDING WIRES BETWEEN SEMICONDUCTOR CHIP AND WIRING SUBSTRATE

This application is based upon and claims the benefit of priority from Japanese patent application No. 2008-257367, filed on Oct. 2, 2008, the disclosure of which is incorporated herein in its entirety by reference.

BACKGROUND OF THE INVENTION

1. Field of the Invention

The present invention relates to a semiconductor device including a semiconductor chip mounted on a wiring substrate.

2. Description of the Related Art

The integration degree of semiconductor chips has been increasing year by year. With the integration degree of the semiconductor chips increasing, the density, performance, and operation speed of the semiconductor chips have been improving. There has also been a demand for a reduction in the size and thickness of semiconductor devices (sometimes referred to as "semiconductor packages") including semiconductor chips. A BGA (Ball Grid Array) structure or a CSP (Chip Size Package) structure, for example, are known as structures for which there is market demand that their sizes be reduced. In these structures, electrode pads on a semiconductor chip mounted on a wiring substrate are connected to wire bond pads on the wiring substrate by a bonding wire or the like. Furthermore, the semiconductor chip mounted on the wiring substrate is sealed with resin. Moreover, solder balls serving as external terminals are provided on a surface (hereinafter referred to as a "back surface") of the wiring substrate located opposite a surface (hereinafter referred to as a "mounting surface") on which the semiconductor chip is mounted.

Here, FIGS. 11 and 12 show a general structure of a semiconductor device (for example, a DRAM (Dynamic Random Access Memory) including a semiconductor chip with electrode pads arranged centrally thereon. FIG. 11 is a sectional view of semiconductor device 8. FIG. 12 is a plan view of a mounting surface side observed after formation of bonding wires (before sealing).

Illustrated semiconductor chip 1 is mounted according to face-up method (a circuit surface of the semiconductor chip faces the opposite side of the mounting surface of the wiring substrate) on the mounting surface of wiring substrate 2. Furthermore, bonding wires 3 are provided as shown in FIGS. 11 and 12 to connect respective electrode pads 4 provided on semiconductor chip 1 to corresponding wire bond pads 5 provided on wiring substrate 2.

In the above-described semiconductor device, the bonding wires, connecting the respective electrode pads provided on the circuit surface of the semiconductor chip to the corresponding wire bond pads provided on the mounting surface of the wiring substrate, need to avoid interfering with edge portions (ends) of the semiconductor chips. Thus, bonding wires 3 need to be shaped as shown in FIG. 11. As a result, wire bond pads 5 need to be provided away from each end of semiconductor chip 1. This increases distance (D1) between the end of semiconductor chip 1 and each wire bond pad 5 on wiring substrate 2. Moreover, distance (D2) between the end of semiconductor chip 1 and a corresponding end of semiconductor device 8 is increased. As a result, the size of semiconductor device 8 is increased.

SUMMARY

An embodiment provides a semiconductor device including a semiconductor chip mounted on a wiring substrate, and a bonding wire connecting an electrode pad provided on the semiconductor chip to a wire bond pad provided on the wiring substrate, wherein a distance from an end of the semiconductor chip to the wire bond pad on the wiring substrate is smaller than the height of the semiconductor chip.

Another embodiment provides a semiconductor device including a bonding wire rising substantially perpendicular from an electrode pad provided on a semiconductor chip so as to be away from the semiconductor chip, falling obliquely toward an end of the semiconductor chip so as to approach the semiconductor chip, subsequently rising again so as to be away from the semiconductor chip, and then falling toward the wire bond pad provided on the wiring substrate.

Another embodiment provides a semiconductor device including a semiconductor chip mounted on a wiring substrate and having an electrode pad, a relay substrate located on the semiconductor chip at a position closer to an end of the semiconductor chip than the electrode pad and having a wire bond pad, a first bonding wire connecting the electrode pad provided on the semiconductor chip to the wire bond pad provided on the relay substrate, and a second bonding wire connecting the wire bond pad provided on the relay substrate to a wire bond pad provided on the wiring substrate.

Still another embodiment provides a method that comprises:

mounting a first semiconductor chip on a wiring substrate, the semiconductor chip including at least one first electrode pad, the wiring substrate including at least one first bond pad; and connecting the first electrode pad to the first bond pad through a first wire by moving a capillary for leading the first wire in accordance with the following sequences (1) to (5):

(1) moving the capillary on the first electrode pad such that a tip end portion of the first wire is bonded to the first electrode pad;

(2) moving the capillary upwardly with respect to a surface of the semiconductor chip up to a first position;

(3) moving the capillary from the first position toward the first bond pad up to a second position;

(4) moving the capillary again from the second position upwardly with respect to the surface of the semiconductor chip up to a third position prior to the capillary reaching an peripheral edge of the semiconductor chip; and (5) moving the capillary from the third position down to the first bond pad.

BRIEF DESCRIPTION OF THE DRAWINGS

The above feature and advantages of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be realized using the teachings of the present invention and that the invention is not limited to the embodiments illustrated for explanatory purpose.

Figure 1:
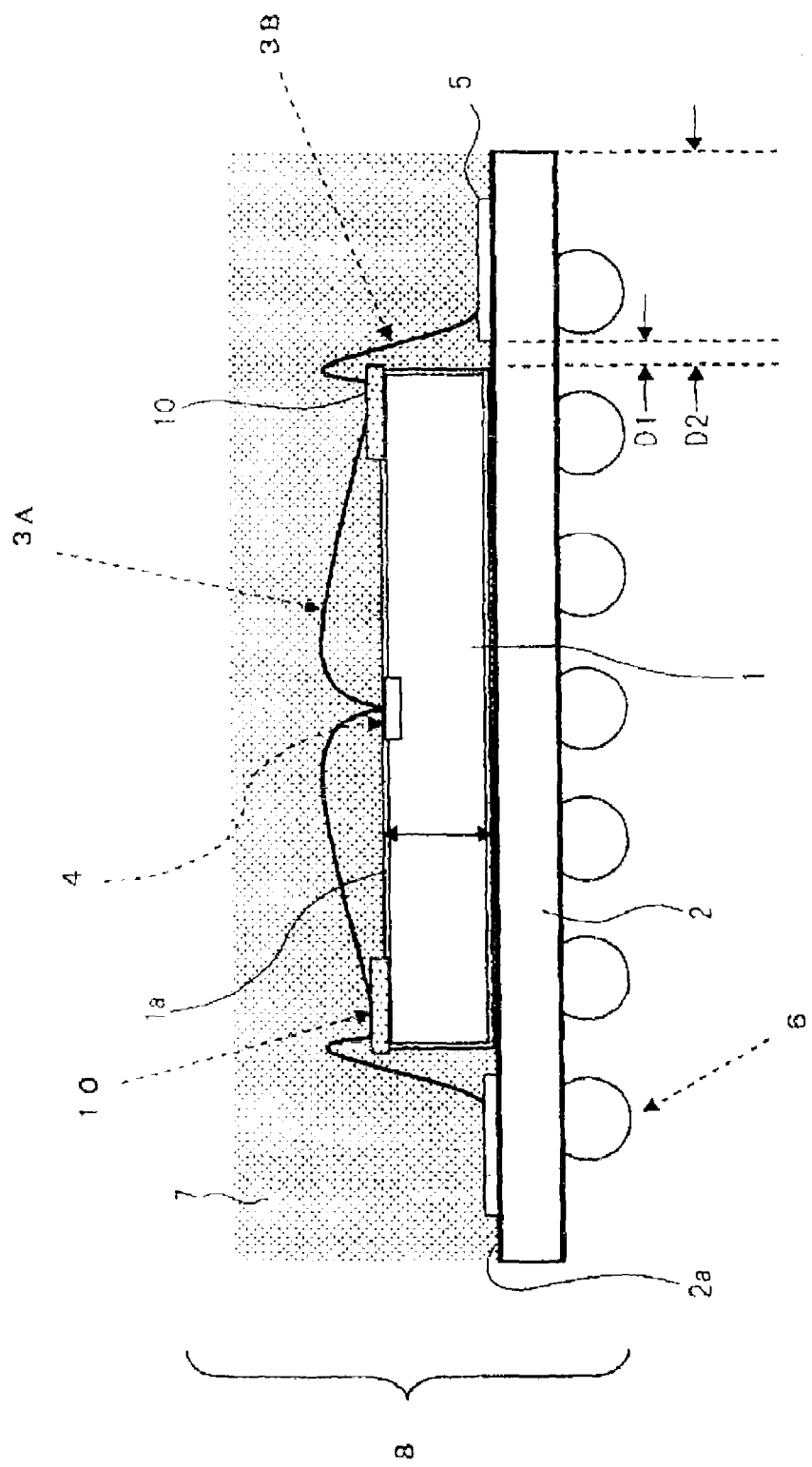
FIG. 1 is a sectional view of a semiconductor device according to a first embodiment.
Figure 2:
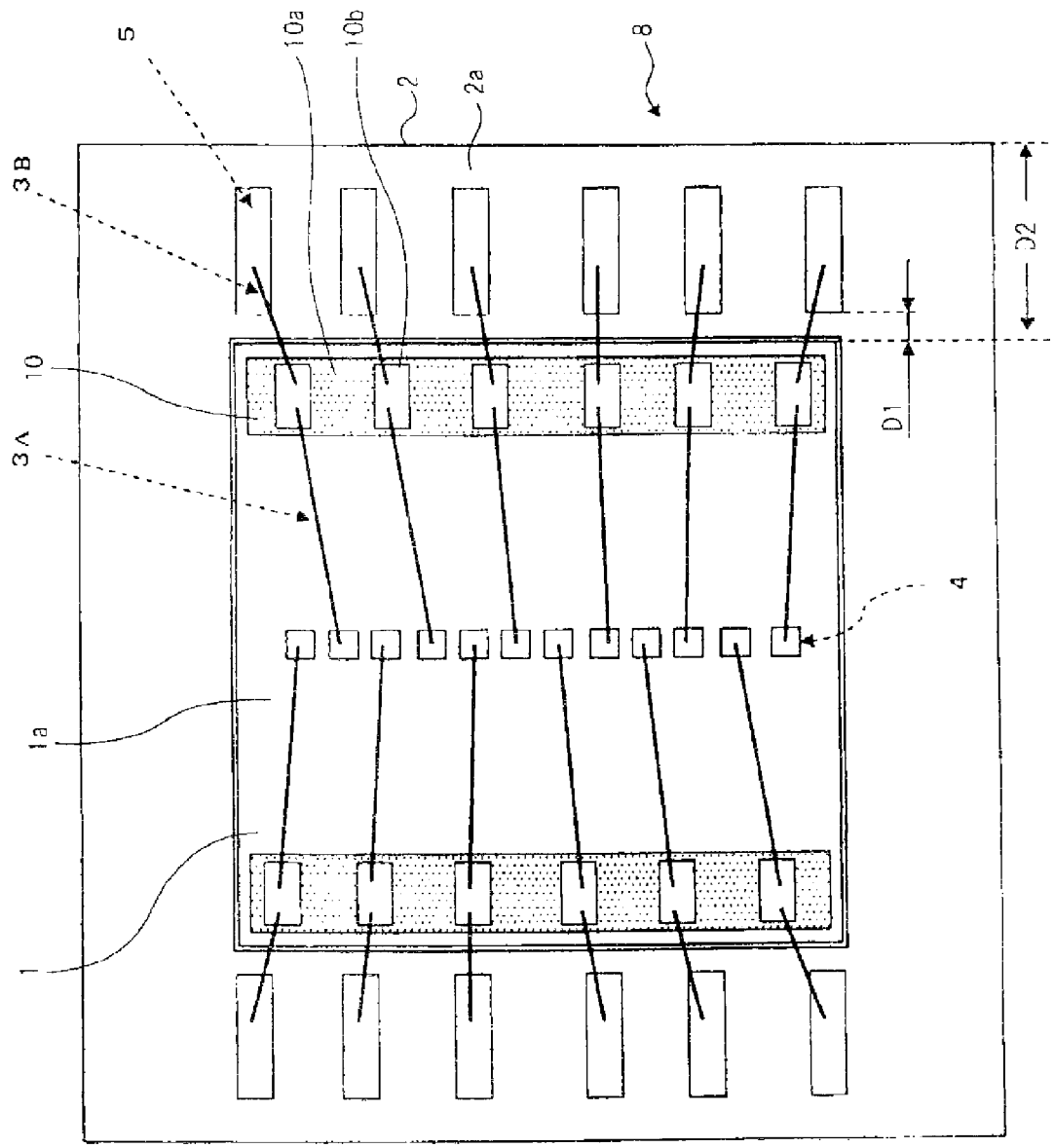
FIG. 2 is a plan view of the semiconductor device according to the first embodiment.

Referring now to FIGS. 1 and 2, semiconductor device 8 according to a first embodiment of the present invention includes wiring substrate 2, and semiconductor chip 1 mounted according to face-up method on mounting surface 2a of wiring substrate 2.

Plurality of electrode pads 4 are arranged centrally on circuit surface 1a of semiconductor chip 1 along a first direction. Here, circuit surface 1a of semiconductor chip 1 means a surface (top surface) located opposite a surface mounted on wiring substrate 2. Moreover, relay substrates (bond pad relay substrates 10) are provided at respective ends of circuit surface 1a of semiconductor chip 1. In other words, relay substrates 10 are provided at the respective ends of the top surface of semiconductor chip 1. Specifically, band-like relay substrates 10 are arranged on the respective sides of and parallel to a row of electrode pads 4 formed along the first direction. In other words, band-like relay substrates 10 are provided along two opposite sides of semiconductor chip 1.

As shown in FIG. 2, each of relay substrates 10 has band-like insulating portion 10a and a plurality of wire bond pads 10b provided along a longitudinal direction of insulating portion 10a.

Each of electrode pads 4 is connected to corresponding wire bond pad 10b on corresponding relay substrate 10 via first bonding wire 3A. Moreover, each wire bond pad 10b on each relay substrate 10 is connected to corresponding wire bond pad 5 on wiring substrate 2 via second bonding wire 3B.

As shown in FIG. 1, second bonding wire 3B rises substantially perpendicular from relay substrate 10 and then falls at a steep angle toward wire bond pad 5 on wiring substrate 2. In other words, second bonding wire 3B rises at a steep angle from wire bond pad 5 on wiring substrate 2 to a position higher than relay substrate 10 and then falls substantially perpendicular toward relay substrate 10.

The above-described structure enables a reduction in distance (D1) between each end (side surface) of semiconductor chip 1 and each of corresponding wire bond pads 5, while preventing the bonding wire connecting corresponding electrode pad 4 on semiconductor chip 1 to corresponding wire bond pad 5 on wiring substrate 2 from interfering with semiconductor chip 1. Moreover, distance (D2) between each end of semiconductor chip 1 and a corresponding end of semiconductor device 8 (a corresponding side surface of wiring substrate 2) can be reduced. As a result, the size of semiconductor device 8 is reduced. In the present embodiment, distance (D1) is smaller (shorter) than the height (thickness T) of semiconductor chip 1.

Figure 3:
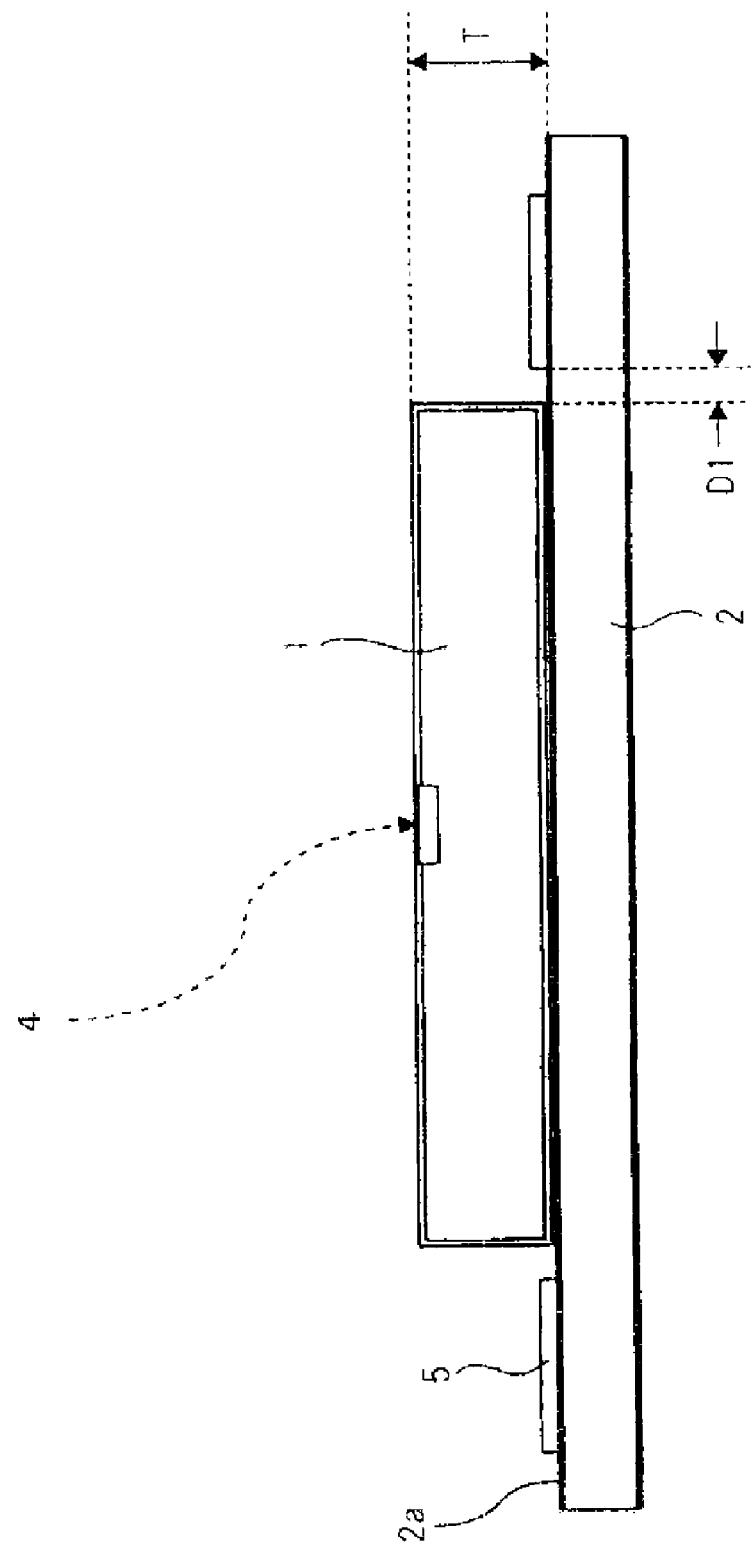
FIG. 3 is a sectional view showing a part of a process of manufacturing the semiconductor device according to the first embodiment.

Now, an example of a method of manufacturing semiconductor device 8 according to the present embodiment will be described with reference to FIGS. 3 to 6. First, as shown in FIG. 3, semiconductor chip 1 is mounted according to face-up method on a mounting area of mounting surface 2a of wiring substrate 2. Wire bond pads 5 are pre-formed around the periphery of the mounting area on wiring substrate 2. Moreover, the positions of wire bond pads 5 are set such that distance (D1) from each of wire bond pads 5 to a corresponding end of semiconductor chip 1 mounted in the mounting area has a predetermined value smaller than that of height (T) of semiconductor chip 1.

Figure 4:
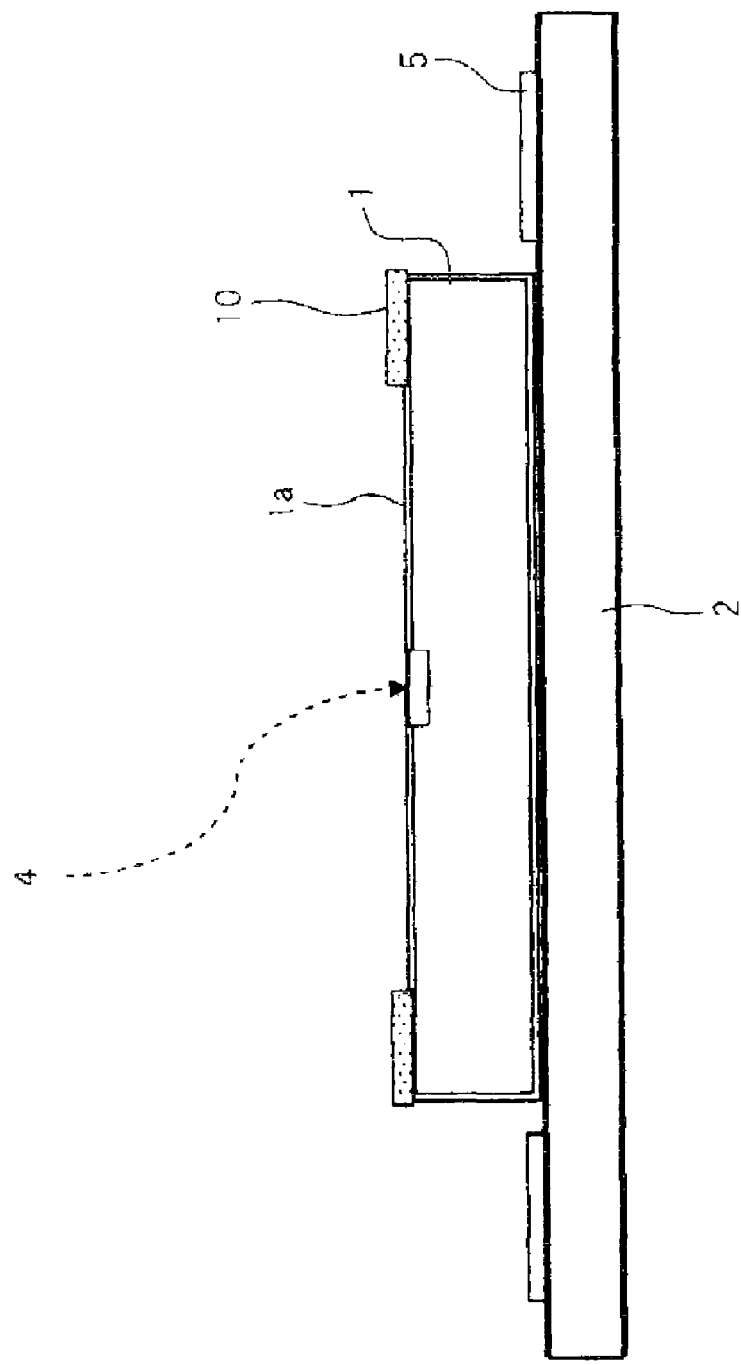
FIG. 4 is a sectional view showing another part of the process of manufacturing the semiconductor device according to the first embodiment.
Figure 5:
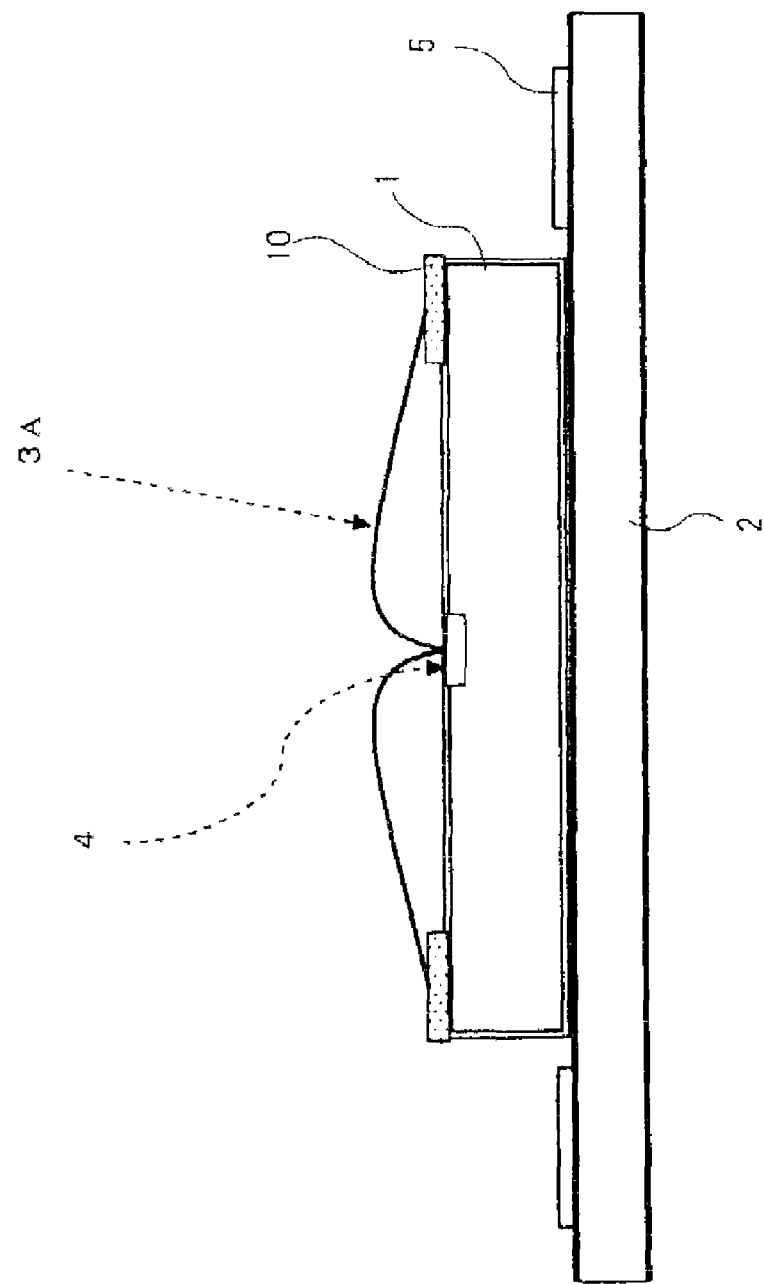
FIG. 5 is a sectional view showing another part of the process of manufacturing the semiconductor device according to the first embodiment.
Figure 6:
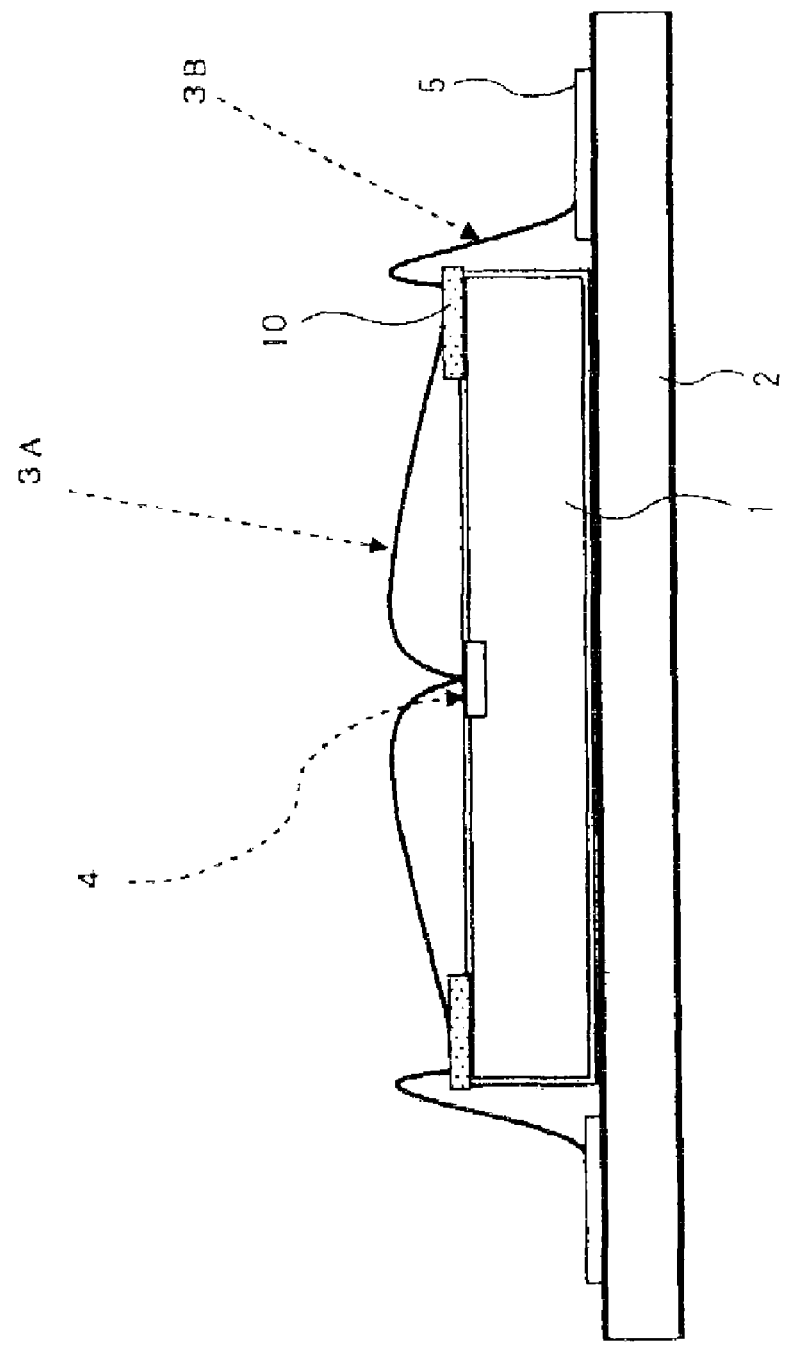
FIG. 6 is a sectional view showing another part of the process of manufacturing the semiconductor device according to the first embodiment.

Then, as shown in FIG. 4, relay substrate 10 is mounted at each end of circuit surface 1a of semiconductor chip 1. Subsequently, as shown in FIG. 5, electrode pads 4 on semiconductor chip 1 are connected (bonded) to each relay substrate 10 via respective first bonding wires 3A. Then, as shown in FIG. 6, each relay substrate 10 is connected (bonded) to corresponding wire bond pads 5 on wiring substrate 2 via respective second bonding wires 3B.

Then, semiconductor chip 1, bonding wires 3A and 3B, and wire bond pads 5 are sealed with resin 7 (FIG. 1). Then, solder balls 6 (FIG. 1) serving as external terminals are formed on the back surface of wiring substrate 2. The order in which the above-described steps are carried out may be changed as required.

Here, as relay substrate 10, a rigid substrate may be used in which a wiring pattern (wire bond pads) made of a conductor such as a copper foil is formed on an insulating substrate (insulating portion) such as an FR4. Alternatively, a tape substrate may be used in which a wiring pattern (wire bond pads) made of a conductor such as a copper foil is formed on a polyimide tape (insulating portion). The rigid substrate has the advantage of reducing costs, and the tape substrate has the advantage of enabling the package to be made thinner. Thus, preferably, the rigid substrate or the tape substrate is selectively used depending on the application of semiconductor device 8.

Furthermore, as is apparent from the description of the manufacturing method, relay substrate 10 is not formed directly on circuit surface 1a of semiconductor chip 1 but on circuit surface 1a after the mounting of semiconductor chip 1 on wiring substrate 2. Thus, the mounting position of relay substrate 10 can be changed easily and inexpensively. In other words, changing the process of manufacturing semiconductor chip 1 is not required even if the mounting position of relay substrate 10 is changed.

Figure 7:
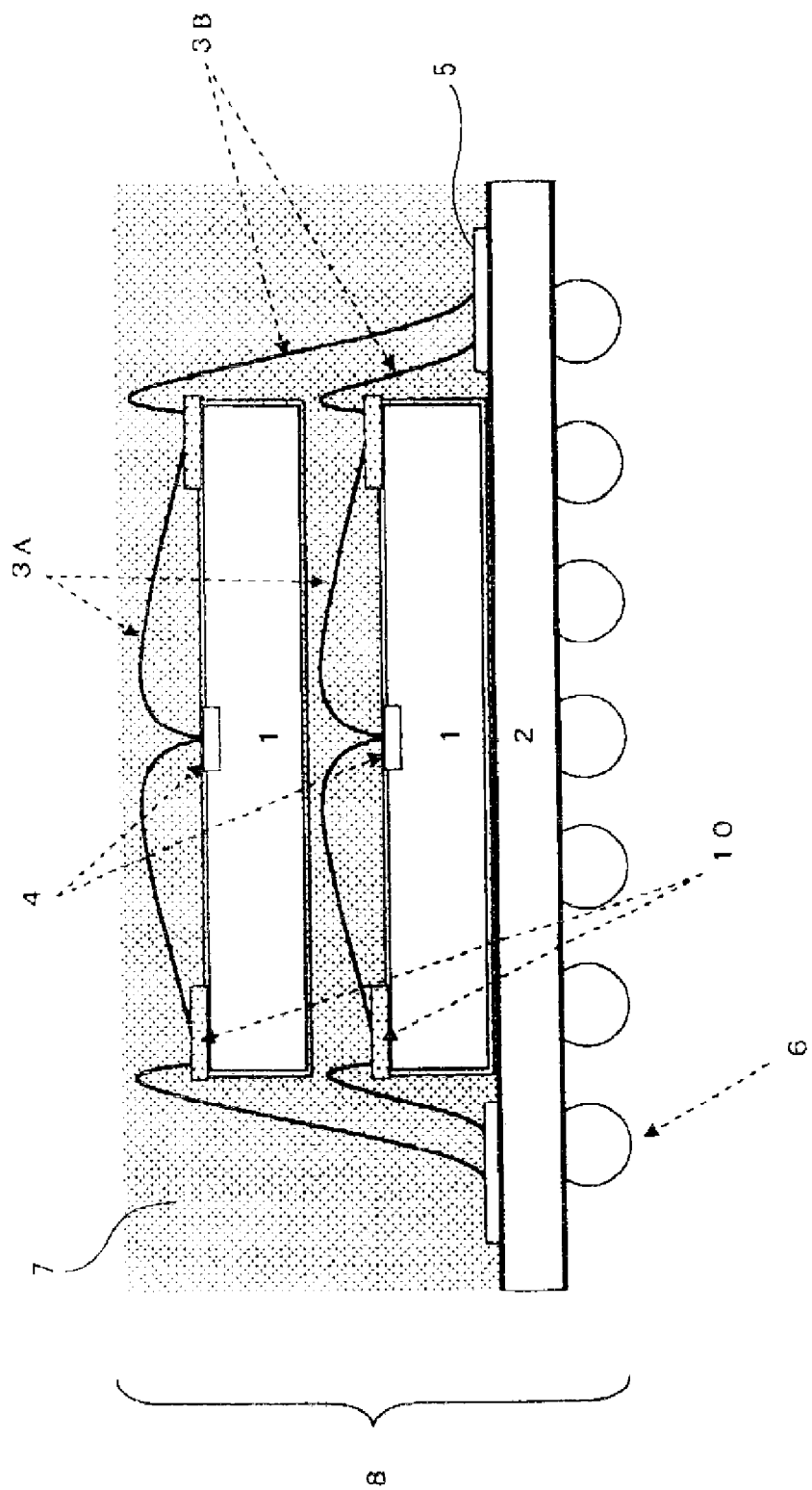
FIG. 7 is a sectional view showing a variation of the semiconductor device according to the first embodiment.

As shown in FIG. 7, on semiconductor chip 1 shown in FIG. 1, similar semiconductor chip 1 may be stacked, and plurality of semiconductor chips 1 may be sealed with resin 7 at a time. FIG. 7 shows a small stack package in which two semiconductor chips 1 are stacked. However, three or more semiconductor chips 1 may be stacked. When a plurality of semiconductor chips are stacked, the following measure is preferably taken to prevent the bonding wires on the lower semiconductor chip from being crushed and deformed, for example, a spacer is interposed between the upper and lower semiconductor chips or the lower semiconductor chip is sealed with resin before the upper semiconductor chip is stacked on the lower semiconductor chip.

Figure 8:
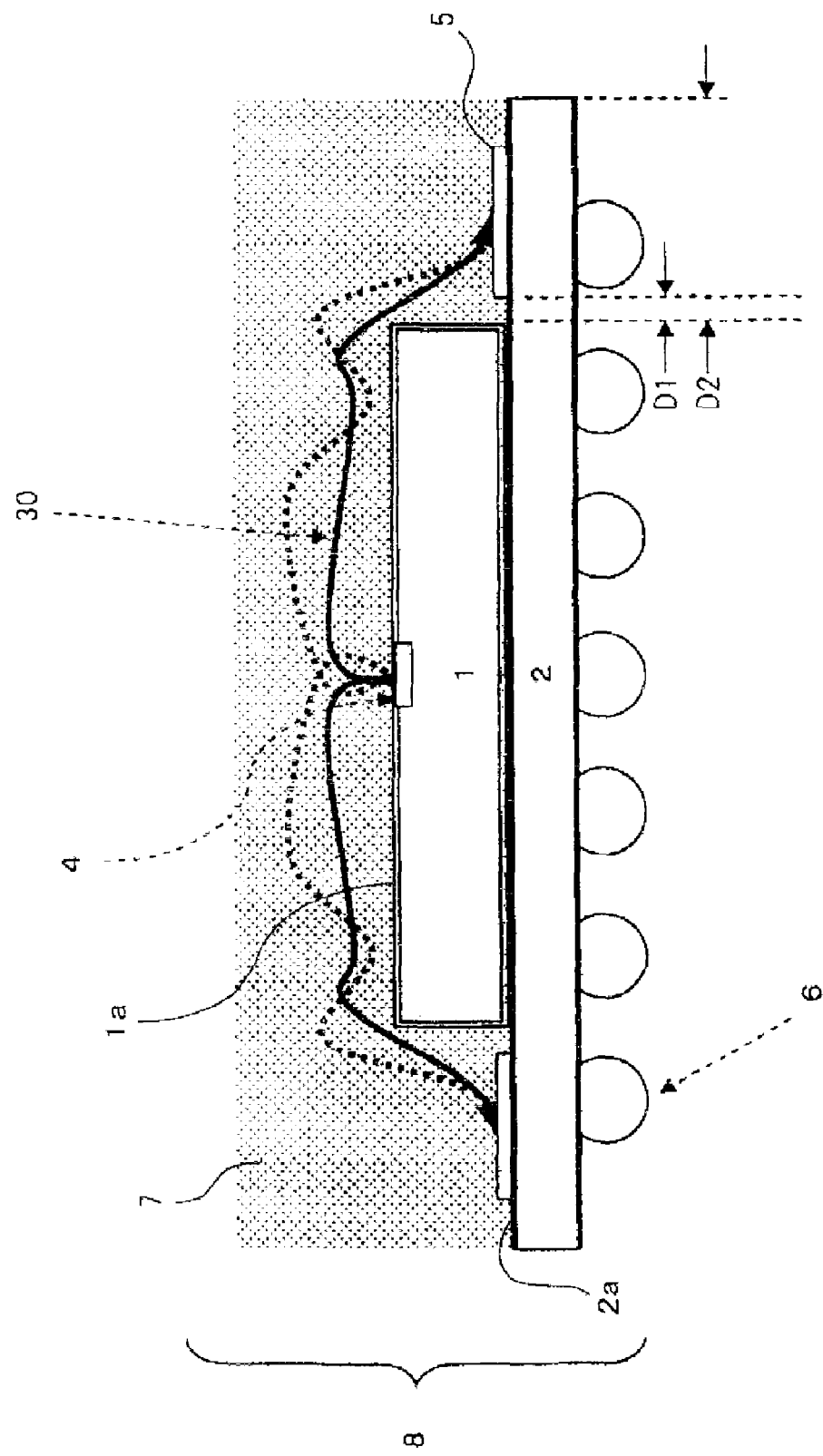
FIG. 8 is a sectional view of a semiconductor device according to a second embodiment.

Referring now to FIG. 8, semiconductor device 8 according to a second embodiment of the present invention includes wiring substrate 2, and semiconductor chip 1 mounted according to face-up method on mounting surface 2a of wiring substrate 2. In FIG. 8, the same components as those of semiconductor device 8 according to the first embodiment are denoted by the same reference numerals. These components will not be described below.

In semiconductor device 8 according to the present embodiment 8, bonding wires 30 connecting respective electrode pads 4 on semiconductor chip 1 to corresponding wire bond pads 5 on wiring substrate 2 are bent as shown in FIG. 8. Specifically, each bonding wire 30 rises substantially perpendicular from corresponding electrode pad 4 so as to be away from circuit surface 1a and then falls so as to incline gently downward toward a corresponding end of semiconductor chip 1 to approach circuit surface 1a. Subsequently, bonding wire 30 rises again so as to be away from circuit surface 1a and then falls at a steep angle toward corresponding wire bond pad 5 provided on the wiring substrate.

Bonding wire 30 shaped as described above can be formed by moving a boding capillary (not shown), which is a nozzle for leading the bonding wire, along a track shown by a dotted line in FIG. 8. Specifically, a wire one end of which is bonded to electrode pad 4 is moved closer to a corresponding end of semiconductor chip 1 and to a position where the wire does not interfere with the end. Subsequently, the wire is moved away from semiconductor chip 1 again and then is moved closer to corresponding wire bond pad 5 at a steep angle. In more detail, the bonding capillary is first moved on a target one of the electrode pads 4 of the chip 1 such that the tip end portion of the wire 30 is bonded to the target pad, followed by moving the capillary upwardly with respect to the circuit surface 1a of the chip up to a predetermined height. At this time, it is preferable to raise up, as shown in FIG. 8, the capillary a little bit on an opposite side to a side on which an associated one of the bond pads 5 of the wiring substrate 2 is provided. The capillary is then moved toward the associated bond pad 5 in approximately parallel to the circuit surface 1a of the chip 1. The capillary is thereafter moved downwardly a little bit toward the circuit surface 1a. In accordance with one of the features of the present invention, the capillary is, prior to reaching the edge of the chip 1, raised up again upwardly with respect to the circuit surface 1a of the chip 1, and then got down to the associated bond pad 5 of the wiring substrate 2. The wire 30 is thus bonded to the bond pad 5 of the substrate 2 and then cut off. The motions as described above are repeated for the other wires 30 connecting the remaining electrode pads 4 and the remaining bond pads 5, respectively.

The above-described structure enables a reduction in distance (D1) between the end of semiconductor chip 1 and each wire bond pad 5 while preventing each bonding wire 30, that connects corresponding electrode pad 4 on semiconductor chip 1 to corresponding wire bond pad 5 on wiring substrate 2, from interfering with semiconductor chip 1. Moreover, distance (D2) between the end of semiconductor chip 1 and the corresponding end of semiconductor device 8 (the corresponding end of wiring substrate 2) can be reduced. Thus, the size of semiconductor device 8 is reduced. Also in the present embodiment, distance (D1) is smaller (shorter) than height (thickness (T)) of semiconductor chip 1.

Figure 9:
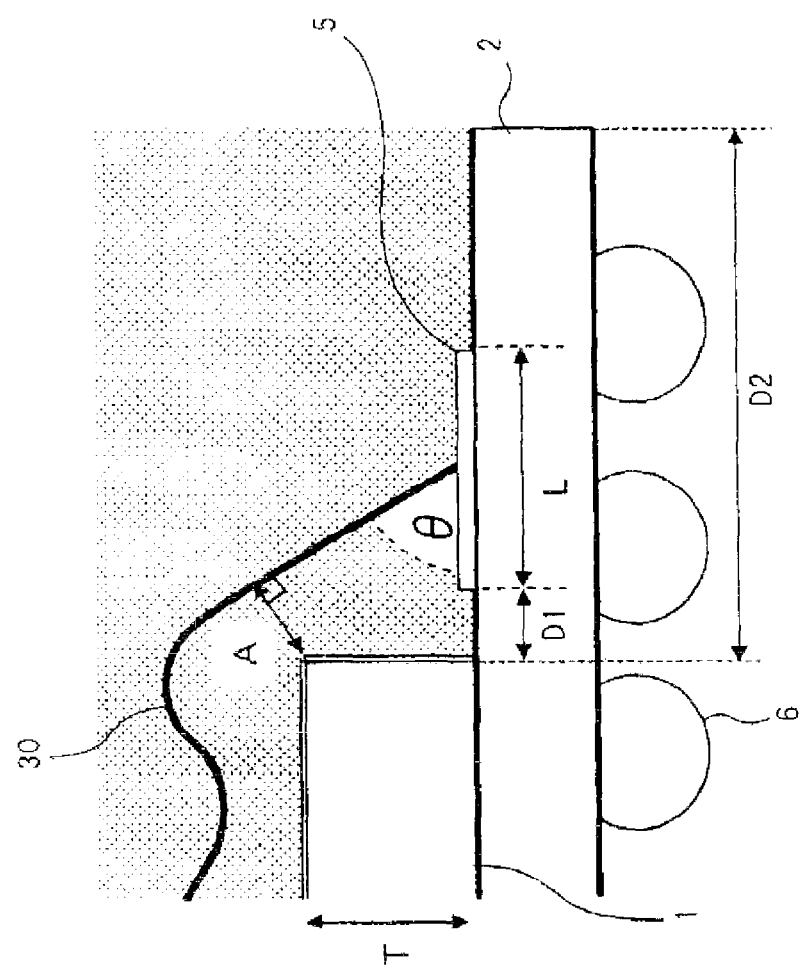
FIG. 9 is a diagram showing the dimensions of components of the semiconductor device according to the second embodiment.

The numerical value of distance (D1) and other numerical values in the present embodiment will be described with reference to FIG. 9. In the present embodiment, distance (D1) is 50 [um], height (L) of wire bond pad 5 is 200 [um], and height (thickness (T)) of semiconductor chip 1 is 190 [um]. That is, the relationship T>(19/20)×D1 holds true between height (thickness (T)) of semiconductor chip 1 and distance (D1). Furthermore, shortest distance (A) from the end (corner) of semiconductor chip 1 to each bonding wire 30 is 20 [um]. In this case, inclination (θ) of bonding wire 30 to the surface of each wire bond pad 5 is 60 degrees. Inclination (θ) can be determined in the following mathematical form:

$$\tan\theta = \frac{T + \dfrac{A}{\cos\theta}}{\left(X + \dfrac{L}{2}\right)}$$

and $$\theta = \arctan\left\{\frac{T}{\left(X + \dfrac{L}{2}\right)}\right\} + \arcsin\left\{\frac{A}{\sqrt{T^2 + \left(X + \dfrac{L}{2}\right)}}\right\}$$

Figure 11:
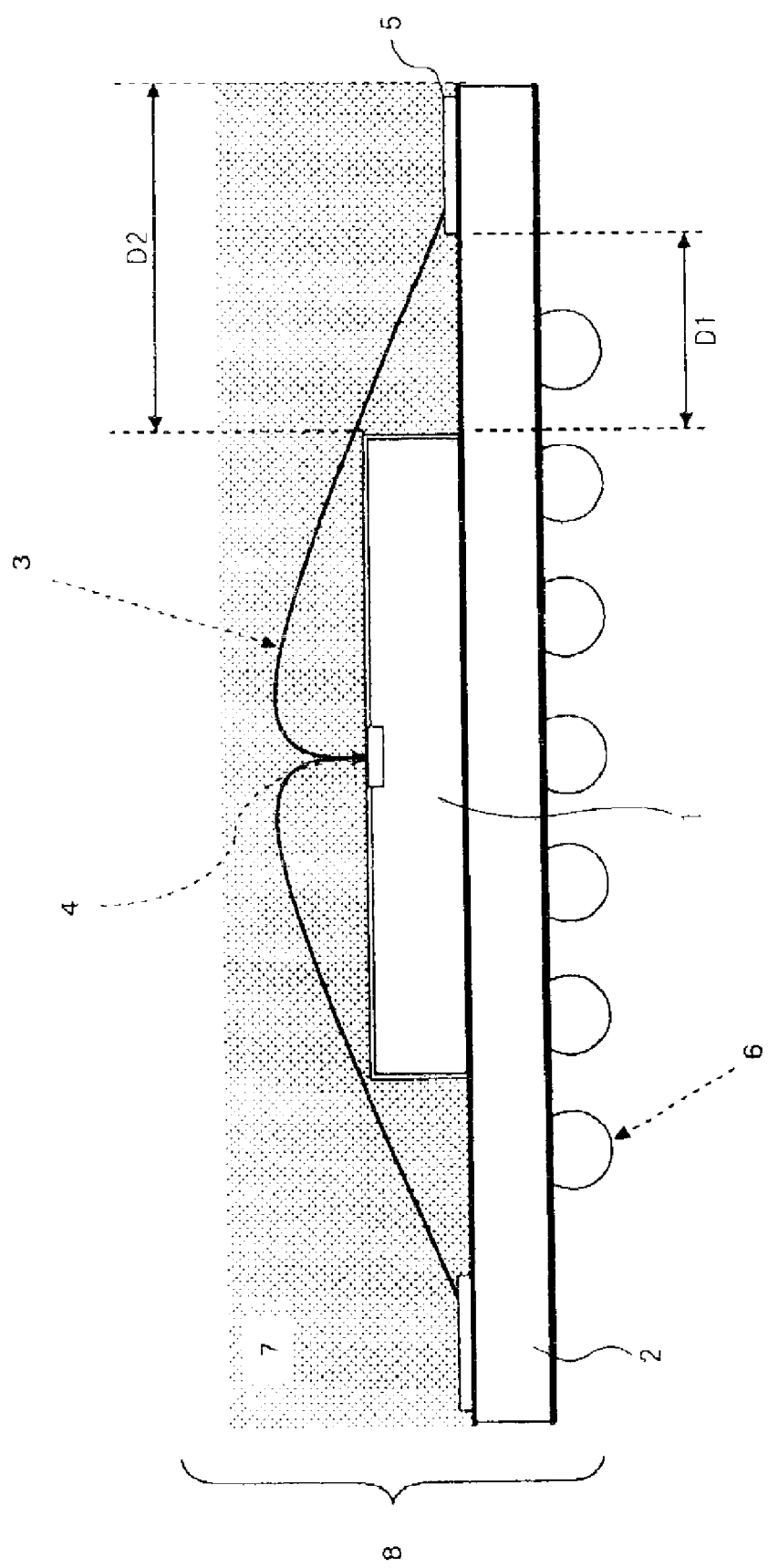
FIG. 11 is a sectional view of a semiconductor device associated with the semiconductor device according to the present invention.
Figure 12:
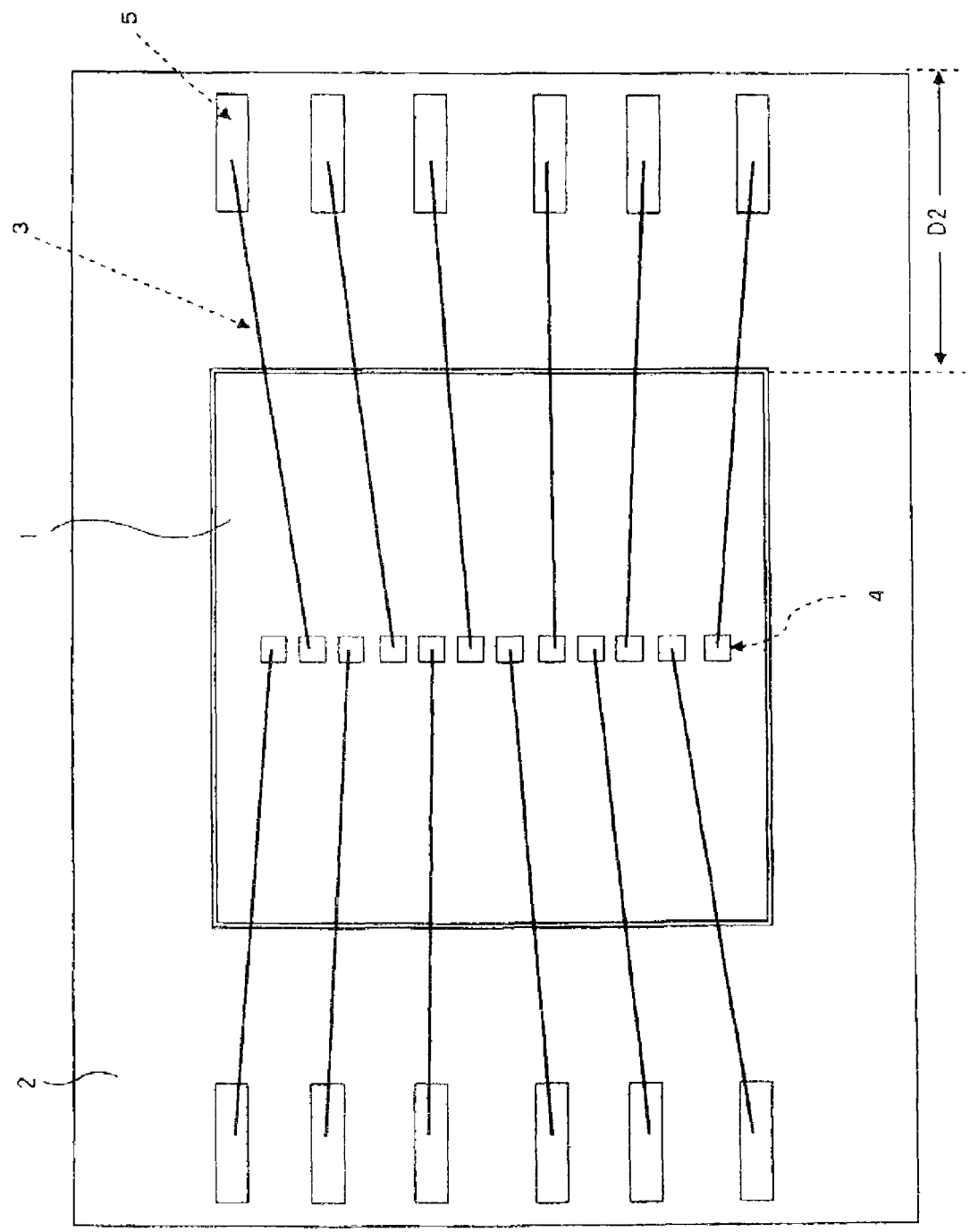
FIG. 12 is a plan view of the semiconductor device shown in FIG. 11.

Distance D1 in semiconductor device 8 shown in FIG. 11 is 200 [um]. Thus, inclination (θ) of bonding wire 3 to the surface of each wire bond pad 5 is 40 degrees. Furthermore, in the present embodiment, distance (D2) between each end of semiconductor chip 1 and the corresponding end of semiconductor device 8 (a corresponding end of wiring substrate 2) is 350 [um]. On the other hand, distance (D2) in semiconductor device 8 shown in FIG. 11 is 500 [um]. That is, the size of semiconductor device 8 according to the present embodiment is reduced by 150 [um] on one side and by 300 [um] as a whole compared to that according to the other embodiments.

Figure 10:
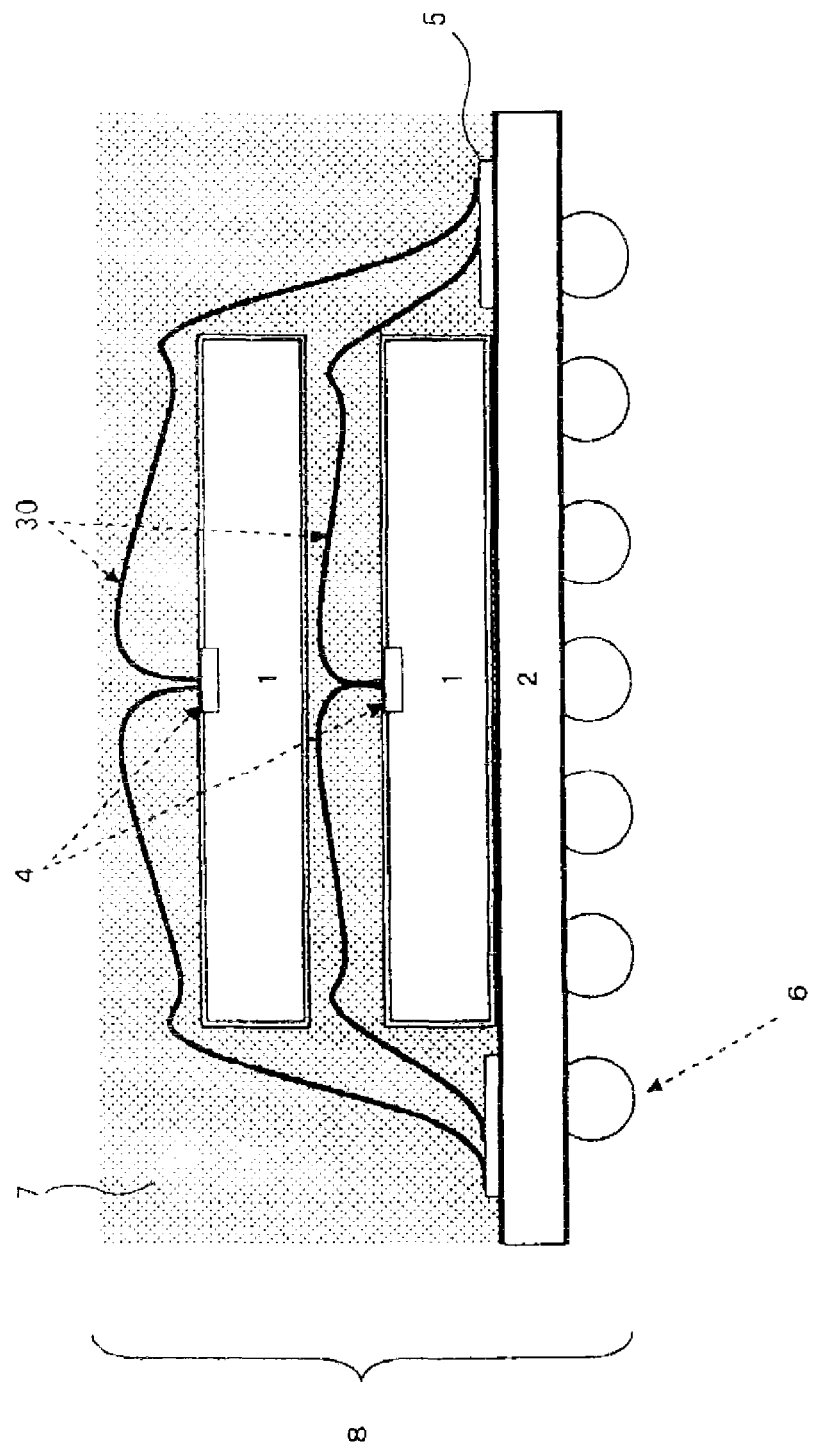
FIG. 10 is a sectional view showing a variation of the semiconductor device according to the second embodiment.

As shown in FIG. 10, on semiconductor chip 1 shown in FIG. 8, similar semiconductor chip 1 may be stacked, and a plurality of semiconductor chips 1 may be sealed with resin 7 at one time. FIG. 10 shows a small stack package in which two semiconductor chips 1 are stacked. However, three or more semiconductor chips 1 may be stacked. When a plurality of semiconductor chips are stacked, the following measure is preferably taken to prevent the upper semiconductor chip from causing, for example, the bonding wires on the lower semiconductor chip to collapse: a spacer is interposed between the upper and lower semiconductor chips or the lower semiconductor chip is sealed with resin before the upper semiconductor chip is stacked on the lower semiconductor chip.

It is apparent that the present invention is not limited to the above embodiments, but may be modified and changed without departing from the scope and spirit of the invention.

What is claimed is:

1. A method, comprising:
    mounting a semiconductor chip on a wiring substrate, the semiconductor chip including a plurality of electrode pads, the wiring substrate including a plurality of bond pads; and
    connecting each of the electrode pad and an associated one of the bond pads by an associated one of wires,
    at least one of the wires rising substantially perpendicularly from an associated electrode pad so as to be away from the semiconductor chip,
    falling obliquely toward an end of the semiconductor chip so as to approach the semiconductor chip, subsequently rising again so as to be away from the semiconductor chip, and then falling toward an associated wire bond pad, the at least one of the wires being continuous between the associated electrode pad and the associated wire bond pad and having no stitch between the associated electrode pad and the associated wire bond pad.

2. The method according to claim 1, further comprising stacking an additional semiconductor chip over the semiconductor chip, the additional semiconductor chips including a plurality of additional electrode pads which are respectively connected to the bond pads of the wiring substrate through additional wires, at least one of the additional wires rising substantially perpendicularly from an associated additional electrode pad so as to be away from the additional semiconductor chip, falling obliquely toward an end of the additional semiconductor chip so as to approach the additional semiconductor chip, subsequently rising again so as to be away from the additional semiconductor chip, and then falling toward an associated wire bond pad.

3. A method, comprising:

mounting a first semiconductor chip on a wiring substrate, the semiconductor chip including at least one first electrode pad, the wiring substrate including at least one first bond pad; and connecting the first electrode pad to the first bond pad through a first wire by moving a capillary for leading the first wire in accordance with the following sequences (1) to (5):

(1) moving the capillary on the first electrode pad such that a tip end portion of the first wire is bonded to the first electrode pad;

(2) moving the capillary upwardly with respect to a surface of the semiconductor chip up to a first position;

(3) moving the capillary from the first position toward the first bond pad up to a second position;

(4) moving the capillary again from the second position upwardly with respect to the surface of the semiconductor chip up to a third position prior to the capillary reaching a peripheral edge of the semiconductor chip; and (5) moving the capillary from the third position down to the first bond pad, the first wire being continuous between the first electrode pad and the first bond pad and having no stitch between the first electrode pad and the first bond pad, wherein the moving the capillary toward the first bond pad includes moving the capillary in approximately parallel to the surface of the semiconductor chip, and wherein the moving the capillary again upwardly with respect to the surface of the semiconductor chip prior to the capillary reaching a peripheral edge of the semiconductor chip is performed after moving the capillary downwardly bit toward the surface of the semiconductor chip.

4. The method according to claim 3, wherein the moving the capillary upwardly with respect to the surface of the semiconductor chip includes raising the capillary up on an opposite side to the bond pad of the wiring substrate.

5. The method according to claim 3, further comprising stacking a second semiconductor chip over the first semiconductor chip, the second semiconductor chip including at least one second electrode pad, and connecting the second electrode pad to another bond pad of the wiring substrate through a second wire by moving a capillary for leading the second wire in accordance with the following sequences (6) to (10):

(6) moving the capillary on the second electrode pad such that a tip end portion of the second wire is bonded to the second electrode pad;

(7) moving the capillary upwardly with respect to a surface of the second semiconductor chip;

(8) moving the capillary toward the another bond pad;

(9) moving the capillary again upwardly with respect to the surface of the second semiconductor chip prior to the capillary reaching a peripheral edge of the second semiconductor chip; and

(10) moving the capillary down to the another bond pad.

6. A method comprising:

mounting a first semiconductor chip over a wiring substrate, the semiconductor chip including at least one first electrode pad, the wiring substrate including at least one first bond pad; and connecting the first electrode pad to the first bond pad through a first wire by moving a capillary for leading the first wire in accordance with the following sequences (1) to (5):

(1) moving the capillary over the first electrode pad such that a tip end portion of the first wire is bonded to the first electrode pad;

(2) moving the capillary upwardly with respect to a surface of the semiconductor chip up to a first position;

(3) moving the capillary from the first position toward the first bond pad up to a second position, the second position being closer to the surface of the semiconductor substrate than the first position;

(4) moving the capillary again from the second position upwardly with respect to the surface of the semiconductor chip up to a third position prior to the capillary reaching a peripheral edge of the semiconductor chip, the third position being apart from the surface of the semiconductor chip more than the first position; and (5) moving the capillary from the third position down to the first bond pad, the first wire being continuous between the first electrode pad and the first bond pad and having no stitch between the first electrode pad and the first bond pad.

7. The method according to claim 6, wherein the moving the capillary upwardly with respect to the surface of the semiconductor chip includes raising the capillary up on an opposite side to the bond pad of the wiring substrate.

8. The method as claimed in claim 6, wherein the moving the capillary from the first position toward the first bond pad includes moving the capillary in approximately parallel to the surface of the semiconductor chip.

9. The method according to claim 8, wherein the moving the capillary from the first position toward the first bond pad further includes moving the capillary down toward the surface of the semiconductor chip up to the second position after moving the capillary in approximately parallel to the surface of the semiconductor chip.

10. The method according to claim 6, further comprising stacking a second semiconductor chip over the first semiconductor chip, the second semiconductor chip including at least one second electrode pad, and connecting the second electrode pad to a second bond pad of the wiring substrate through a second wire by moving a capillary for leading the second wire in accordance with the following sequences (6) to (10):

(6) moving the capillary over the second electrode pad such that a tip end portion of the second wire is bonded to the second electrode pad;

(7) moving the capillary upwardly with respect to a surface of the second semiconductor chip;

(8) moving the capillary toward the second bond pad;

(9) moving the capillary again upwardly with respect to the surface of the second semiconductor chip prior to the capillary reaching a peripheral edge of the second semiconductor chip; and

(10) moving the capillary down to the second bond pad, the second wire being continuous between the second electrode pad and the second bond pad and having no stitch between the second electrode pad and the second bond pad.

* * * * *